US006992532B2

(12) United States Patent
Christensen

(10) Patent No.: US 6,992,532 B2
(45) Date of Patent: Jan. 31, 2006

(54) IGFET AND TUNING CIRCUIT

(75) Inventor: Kaare Tais Christensen, Copenhagen (DK)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/631,833

(22) Filed: Aug. 1, 2003

(65) Prior Publication Data

US 2004/0021181 A1 Feb. 5, 2004

Related U.S. Application Data

(62) Division of application No. 09/917,703, filed on Jul. 31, 2001, now Pat. No. 6,624,484.

(51) Int. Cl.
*H03B 5/08* (2006.01)
(52) U.S. Cl. .......................... 331/117 FE; 331/117 R; 331/167; 331/177 R; 327/263
(58) Field of Classification Search ............. 331/36 C, 331/36 L, 114, 167, 117 R, 117 FE, 177 R, 331/181; 327/263
See application file for complete search history.

(56) References Cited

U.S. PATENT DOCUMENTS

| 4,636,825 A | 1/1987 | Baynes |
| 4,737,837 A | 4/1988 | Lee |
| 5,635,736 A | 6/1997 | Funaki et al. |
| 5,693,966 A | 12/1997 | Anazawa et al. |
| 6,239,665 B1 * | 5/2001 | Strom .................. 331/117 FE |
| 2002/0070815 A1 | 6/2002 | Traub |

FOREIGN PATENT DOCUMENTS

| DE | 10052170 A1 | 10/2000 |
| EP | 0724293 | 7/1996 |
| JP | 8116212 | 5/1996 |

* cited by examiner

*Primary Examiner*—Donghee Kang
(74) *Attorney, Agent, or Firm*—Antonelli, Terry, Stout and Kraus, LLP.

(57) ABSTRACT

A tuning circuit comprising a first reactance, a second reactance and a insulated gate field effect transistor having a gate arranged to receive a control signal. The first reactance is connected between the source of the field effect transistor and a first node. The second reactance has the same value as the first reactance and is connected between the drain of the field effect transistor and a second node. The first and second nodes are arranged so as to experience a balanced ac signal. Turning the field effect transistor on has the effect of making the first and second reactances effective in the circuit and vice versa.

31 Claims, 6 Drawing Sheets

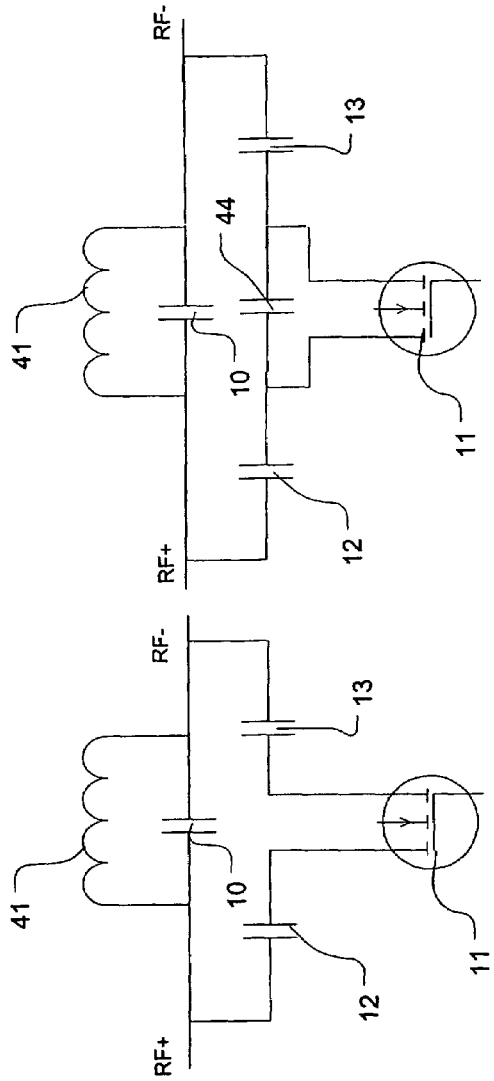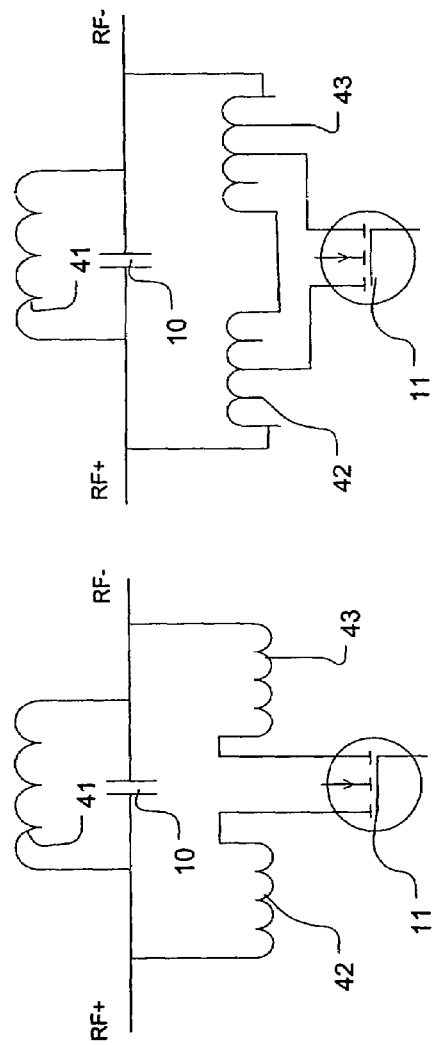
Figure 6a  Figure 6b  Figure 6c  Figure 6d

IGFET AND TUNING CIRCUIT

The application is a Rule 53(b) divisional application of U.S. patent application Ser. No. 09/917,703 filed Jul. 31, 2001 now U.S. Pat. No. 6,624,484, the subject matter of which is incorporated herein by reference.

BACKGROUND OF THE INVENTION

1. Field of the Invention

The present invention relates to an insulated gate field effect transistor and a tuning circuit.

2. Description of the Prior Art

LC tuned circuits are widely used in RF circuits, such as oscillators and tuned amplifiers, it is often necessary, for instance in multiband radio equipment, to change the resonant frequency of a circuit. At HF frequencies, relays can be used to switch capacitors, inductors or entire tuned circuits into and out of use. However, at higher frequencies, relays become unsuitable. Furthermore, relays have a relatively high current demand and are undesirable at any frequency for this reason.

Subsequently, PIN diodes came to be used for RF switching, including the switching of capacitors and inductors into and out of tuned circuits. However, in order for a PIN diode switch to close, the PIN diode must be forward biased which results in a significant current flow.

The use of MOSFETs to effect switched tuning has the advantage of negligible current demand and has been proposed in Kral, A. et al, "RF-CMOS Oscillators with Switched Tuning", *Proceedings of the Custom Integrated Circuits Conference*, pp 555–558, 1998, Kuhn, W. et al., "A 200 MHz CMOS Q-Enhanced LC Bandpass Filter", *IEEE Journal of Solid-state Circuits*, Vol. 31, no. 8, pp 1112–1122, August 1996 and Cho, T. et al., "A Single-Chip CMOS Direct-Conversion Transceiver for 900 MHz Spread-Spectrum Digital Cordless Phones", *Proceedings of the IEEE International Solid-State Circuits Conference*, pp 228–229 & 464, 1999. However, the use of MOSFETs in this way has not become commonplace.

Furthermore, the known circuits are restricted to switching components in an out of circuit by controlling the resistance between a node, e.g. one terminal of a capacitor, and an AC ground, typically 0V for NMOS devices and +V for PMOS devices.

SUMMARY OF THE INVENTION

According to the present invention, there is provided a tuning circuit comprising a first reactance, a second reactance and a insulated gate field effect transistor having a gate arranged to receive a control signal, the first reactance being connected between the source of the field effect transistor and a first node and the second reactance having the same value as the first reactance and being connected between the drain of the field effect transistor and a second node, wherein the first and second nodes are arranged so as to experience a balanced ac signal. The field effect transistor may be a p- or n-channel device and is preferably an enhancement mode device. A balanced ac signal comprises two waveforms which are reciprocal relative to an ac ground, such as is found in a balanced transmission line.

The first and second reactances may be both either capacitors or inductors.

A capacitor and/or an inductor may be connected between said nodes.

According to the present invention, there is also provided an insulated gate field effect transistor comprising source and drain regions within a surrounding region and gate electrode means provided over a channel or channels between said source and drain region and over at least part of the boundary between said source and drain regions and said surrounding region, said surrounding region being provided with ground connection means for connection to an AC ground. The source and drain regions are preferably n- or $n^+$-type within a p-type substrate region. If, however, the source and drain regions are p- or $p^+$-type, the substrate region may be an n-type region within a greater p-type region, if the source and drain regions are n+-type the surrounding region is n- or n+-type and if the source and drain regions are p- or p+-type the surrounding region is p- or p+-type. The normalized substrate resistance of PMOS devices can be much lower than that for NMOS devices. Accordingly, when sized correctly PMOS devices can perform better that NMOS devices for switching tuning components.

The ground connection means is distinct from and in addition to the conventional substrate connection found in insulated gate field effect devices.

Preferably, the ground connection means comprises a plurality of interconnected ohmic contacts to said substrate region.

Preferably, the gate electrode means encompasses said source and drain regions.

The source and drain regions may be in a finger structure arrangement. Preferably, however, the source and drain regions are in a waffle structure arrangement.

Metallic interconnections are provided between the sources and metallic interconnections between the drain regions and between the source regions of small insulated gate field effect transistor having multi-drain/multi-source topographies, e.g. the waffle structure.

Preferably, therefore the insulated gate field effect transistor includes a plurality of source and drain regions and an interconnection layer in which said source regions are connected together and said drain regions are connected together, the conductors of the interconnection layer being connected to said source and drain regions by splaying conductive paths. Splaying the connections in this way increases the spacing between the points which need to be interconnected in an interconnection layer.

Preferably, said source and drain regions are in a waffle structure arrangement. More preferably, the interconnection layer comprises a source interconnection structure and a drain interconnection structure, said structures comprising respective sets of fingers extending diagonally, with respect to said waffle structure arrangement, which are interdigitated.

An insulated gate field effect transistor according to the present invention may be advantageously employed in a circuit according to the present invention.

A circuit according to the present invention may be employed in a resonant circuit such as an oscillator or a filter.

According to the present invention, there is further provided an insulated gate field effect transistor comprising a plurality of source and drain regions and an interconnection layer in which said source regions are connected together and said drain regions are connected together, the conductor or conductors of the interconnection layer being connected to said source and drain regions by splaying conductive paths.

Preferably, said source and drain regions are in a waffle structure arrangement. More preferably, the interconnection layer comprises a source interconnection structure and a drain interconnection structure, said structures comprising respective sets of fingers extending diagonally, with respect to said waffle structure arrangement, which are interdigitated.

BRIEF DESCRIPTION OF THE DRAWINGS

FIGS. 6a to 6d illustrate alternative tuning circuits.

DETAILED DESCRIPTION OF THE PREFERRED EMBODIMENTS

Embodiments of the present invention will now be described, by way of example, with reference to the accompanying drawings.

Figure 1:
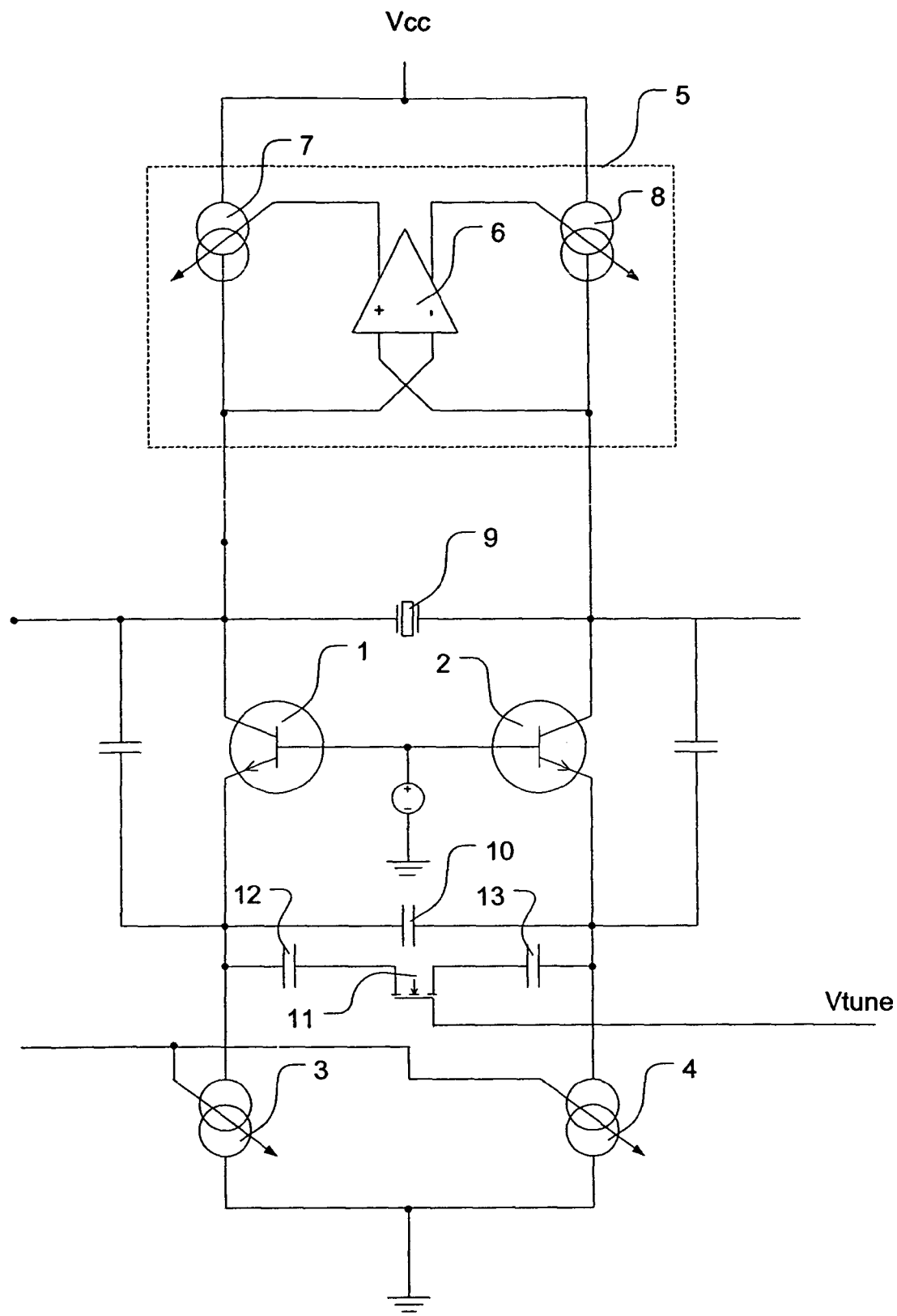
FIG. 1 is a simplified circuit diagram of a voltage controlled variable frequency crystal oscillator.
Figure 5:
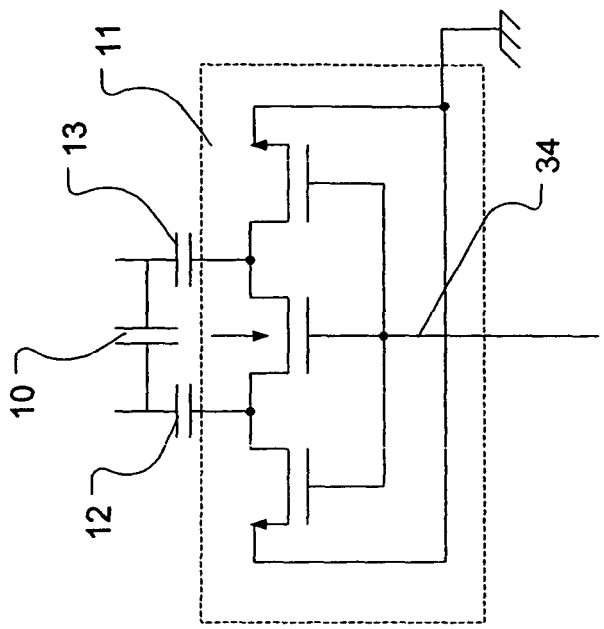
FIG. 5 shows the equivalent circuit of the device of FIG. 2.

Referring to FIG. 1, a voltage controlled crystal oscillator comprises a pair of transistors 1, 2, first and second current sources 3, 4 for controlling the emitter currents of the transistors 1, 2 and an active, cross-coupled load arrangement 5 providing the collector loads for transistors 1, 2. The load arrangement 5 comprises a differential amplifier 6 and third and fourth controlled current sources 7, 8 connected between the collectors of respective transistors 1, 2 and Vcc. The controlled current sources 7, 8 are controlled by the differential amplifier 6 whose inputs are connected to the collectors of respective transistors 1, 2.

The frequency determining components of the oscillator comprise a quartz crystal 9, a first capacitor 10 between the emitters of the transistors 1, 2, an n-channel depletion mode MOSFET 11, a second capacitor 12 connected between the drain of the MOSFET 11 and the emitter of the first transistor 1 and a third capacitor 13 connected between the source of the MOSFET 11 and the emitter of the second transistor 2.

Briefly stated, when a low voltage is applied to the gate of the MOSFET 11, its source-drain resistance is high and the second and third capacitors 12, 13 do not significantly effect the frequency of the oscillator. However, if a relatively high voltage is applied to the gate of the MOSFET 11, its drain-source resistance is low and the frequency of the oscillator is lowered due to the effect of the second and third capacitors 12, 13 in parallel with the first capacitor 10. Thus, a step change in the frequency of the oscillator can be achieved by changing the voltage Vtune on the gate of the MOSFET 11.

Figure 2:
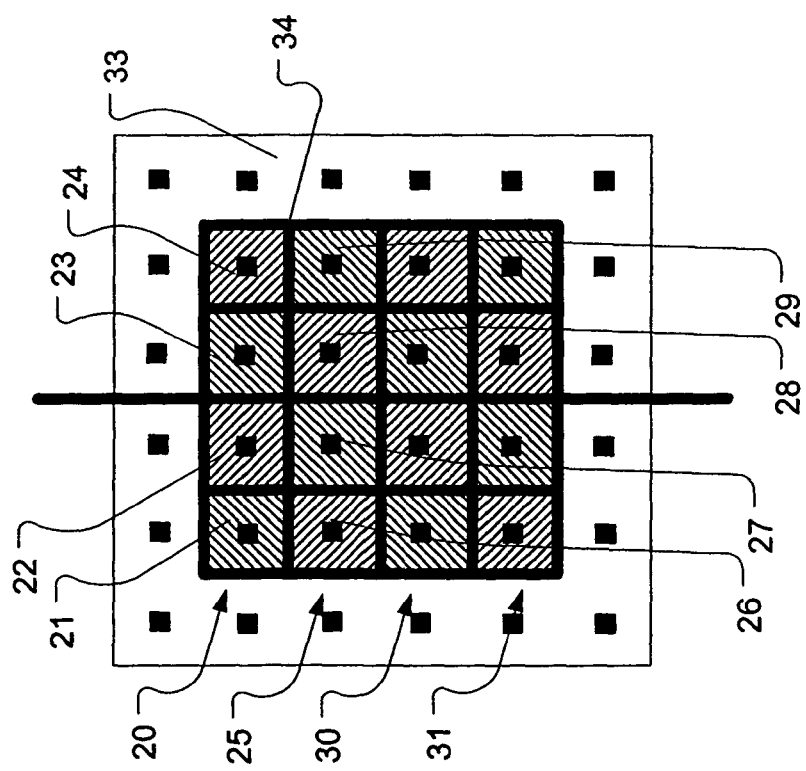
FIG. 2 illustrates the arrangement of semiconductor regions of the switching device used in the circuit of FIG. 1.

Referring to FIG. 2, the MOSFET 11 has a 4×4 waffle structure which provides for relatively low source-drain parasitic capacitances. The first row 20 of the waffle structure consists of a first source region 21, a first drain region 22, a second source region 23 and a second drain region 24. The second row 25 of the waffle structure consists of a first drain region 26, a first source region 27, a second drain region 28 and a second source region 29. The third row 30 is the same as the first row 20 and the fourth row 31 is the same as the second row 25.

Referring also to FIGS. 3a to 3d and 4, the source and drain regions 21, . . . , 24, 26, . . . , 29 are n+doped areas within a p-type substrate. An n-type region 33 surrounding the waffle structure is connected at frequent intervals to AC ground. The gate electrode 34 comprises a polysilicon grid. In addition to overlying the channel regions between source and drain regions, the gate electrode 34 includes a solid perimeter which overlays the gap between the outer source and drain regions 21, . . . , 24, 26, 29 and the n-type region 33.

Figure 3A:
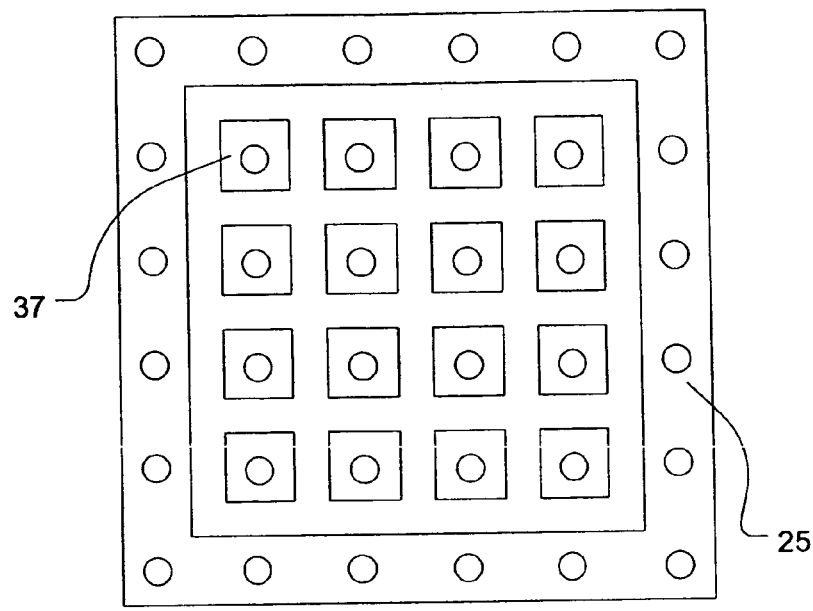
FIGS. 3a to 3d illustrate successive metallisation layers of the device of FIG. 2.

Referring particularly to FIG. 3a, a first metallisation layer comprises a square interconnect ring 25, connecting vias 36 to contacts with the n-type region 33 surrounding the waffle, and pads 37 atop respective vias to source and drain regions 21, . . . , 24, 26, . . . , 29.

Figure 3B:
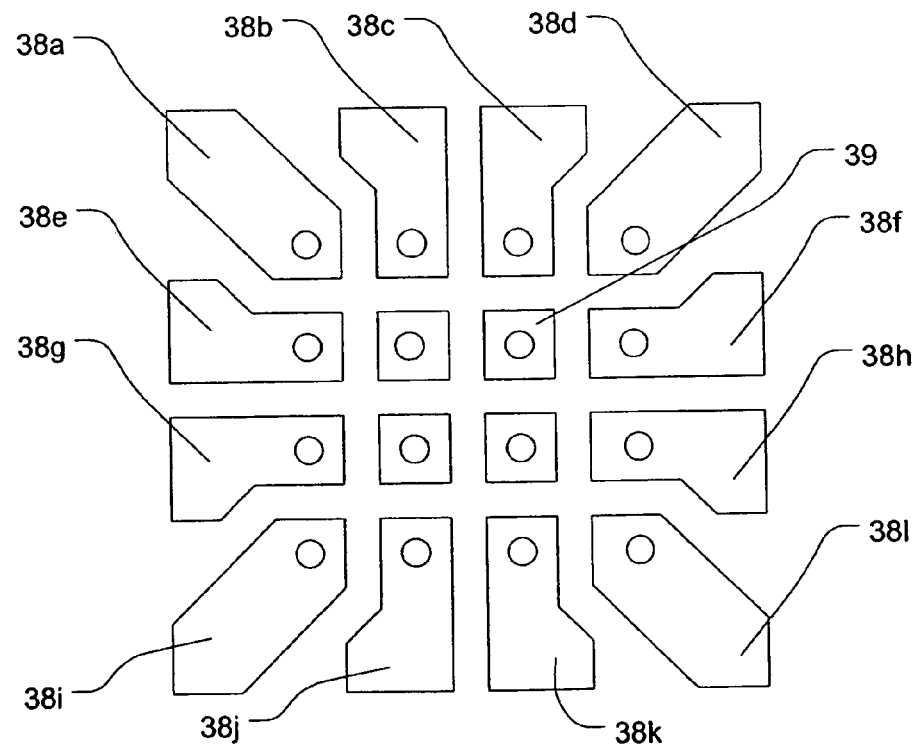

Referring particularly to FIG. 3b, a second metallisation layer comprises lateral conductor paths 38a, . . . , 38l radiating from the tops of vias to respective peripheral source and drain regions 21, . . . , 24, 26, 29. The corner conductor paths 38a, 38d, 38i, 38l extend diagonally away from the waffle. The other conductor paths 38b, 38c, 38e, 38f, 38g, 38h, 38j, 38k extend parallel to axes of the waffle and are broadened at their outer ends in the direction of the nearest corner conductor path 38a, 38d, 38i, 38l. The second metallisation layer also comprises pads 39 atop vias to the pads 37 of the first metallisation layer over the other source and drain regions 27, 28.

Figure 3C:
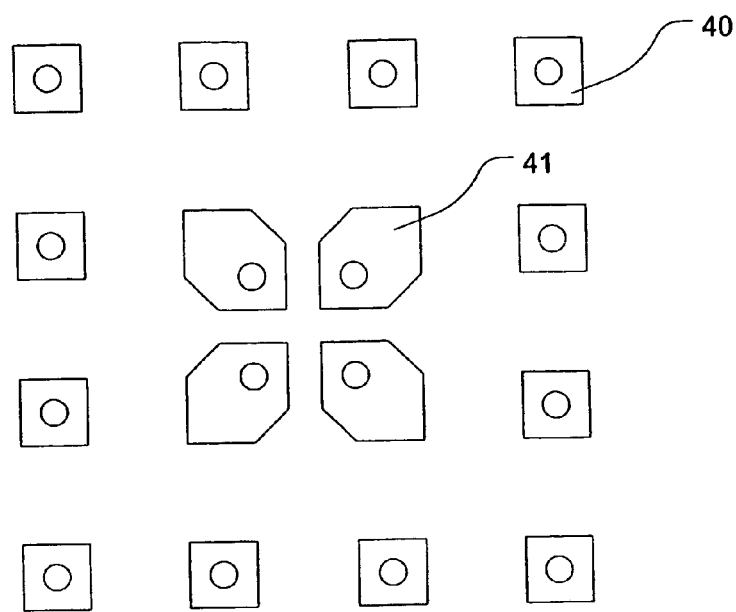

Referring particularly to FIG. 3c, a third metallisation layer comprises twelve evenly spaced pads 40 arranged to form the sides of a square, each atop a via to an outer end of one of the conductor paths 38a, . . . , 38l of the second metallisation layer. The third metallisation layer also includes short diagonally radiating conductor paths 41 from the tops of vias to the pads 39 of the second metallisation layer.

Figure 3D:
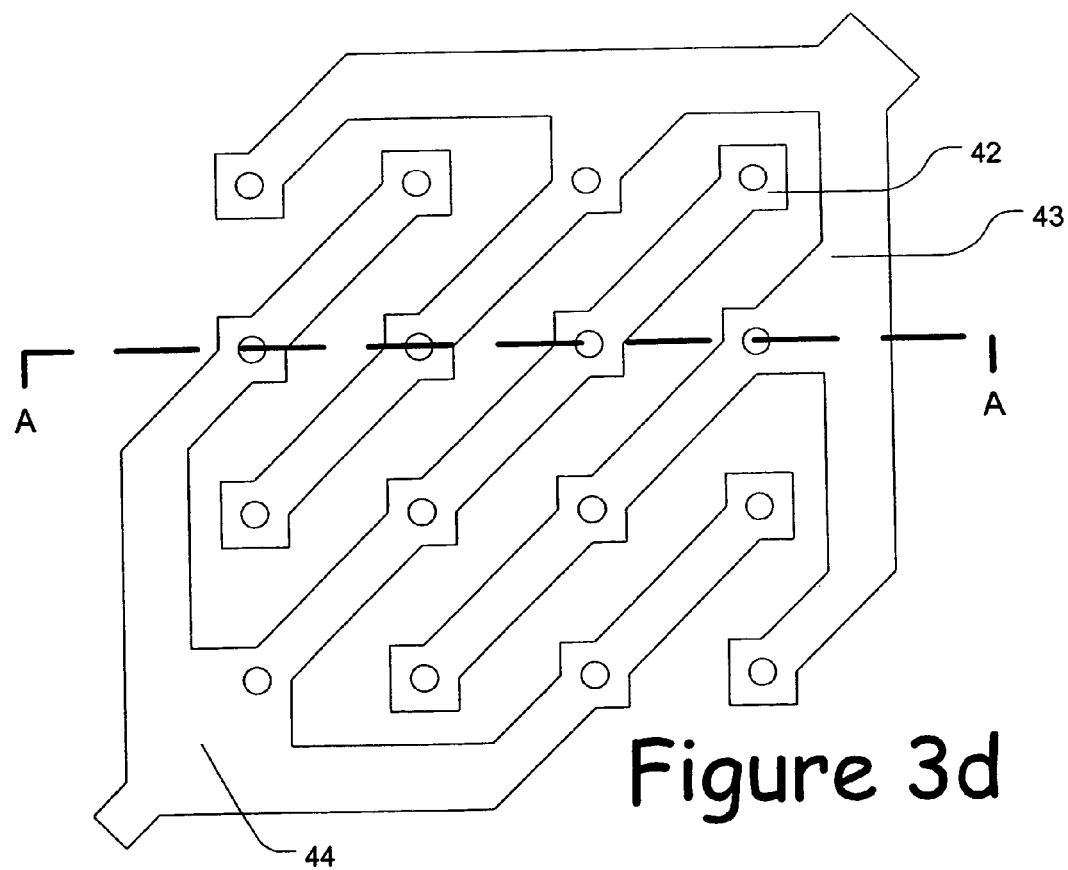
Figure 4:
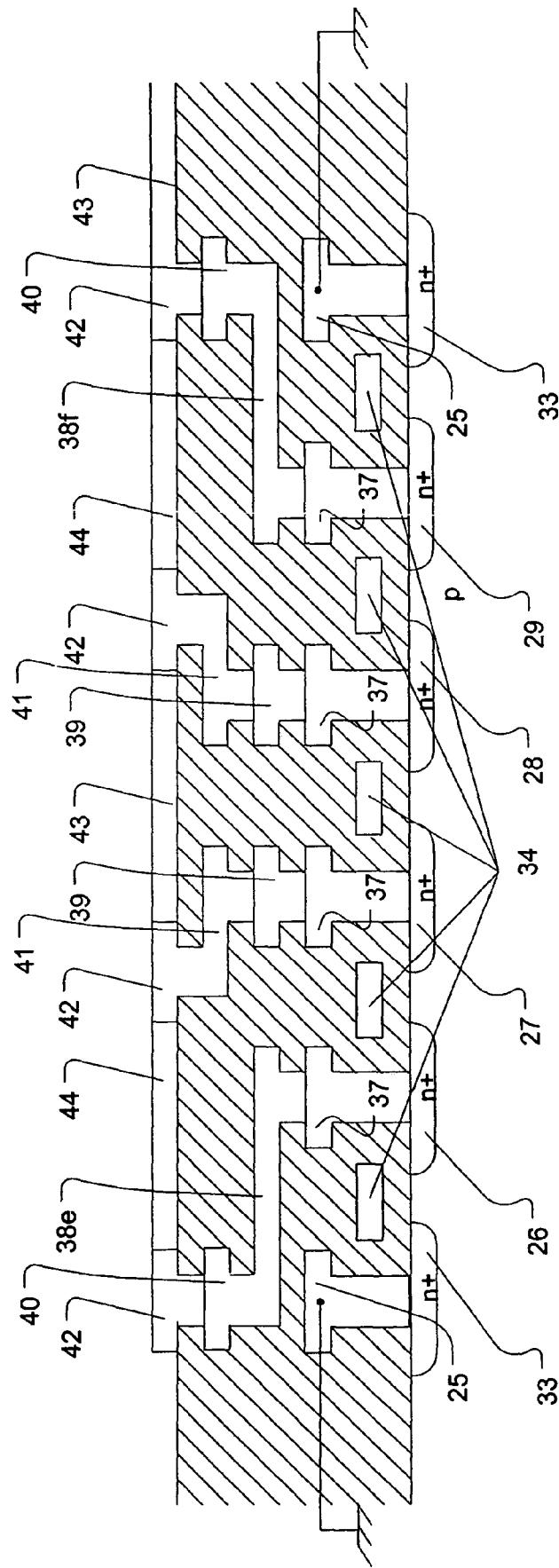
FIG. 4 is a sectional view of the device shown in FIG. 2.

Referring particularly to FIG. 3d, vias are formed from the pads 40 and the outer ends of the conductor paths 41 of the third metallisation layer. A fourth metallisation layer comprises a square array of regularly spaced pads 42 at the top of these vias, a first conductor pattern 43 interconnecting the pads 42 connected to source regions 21, 23, 27, 29 and a second conductor pattern 44 interconnecting the pads 42 connected to drain regions 22, 24, 26, 28. The first and second conductor patterns 43, 44 each comprise a set of diagonally extending fingers. The fingers of the first conductor pattern 43 are interdigitated with those of the second conductor pattern 44.

The center to center separation of neighboring pads 42 in the fourth metallisation layer is much greater than that of the underlying source and drain regions 21, . . . , 24, 26, . . . , 29 due to the radiating paths 38a, . . . , 38l, 41 in the second and third metallisation layers, making formation of the first and second conductor patterns 43, 44 easier.

The extension of the gate electrode 34 to overlie the border between the outer source and drain regions and the surrounding n-type region has been found to have several advantageous effects, including:

(a) reduced effective resistance to ground when the MOSFET is turned on;
 (b) the drain and source regions are rapidly biased at the desired bias level when the switch is turned on;
 (c) when the MOSFET is turned off, the parasitic drain/source capacitance is reduced because the outer side walls of the outer diffusion regions have much more capacitance that the gate-side walls due to the lightly doped diffusion used in modern processes near the gate; and (d) the Q of the junction capacitance is improved because the distributed substrate resistance to ground has been reduced by the increased proximity and number of ground terminals.

The first and second conductor patterns 43, 44 can be made symmetrical by arranging for there to be an even number of rows and an odd number of columns, or vice versa, in the waffle structure.

While the present invention has been described above in the context of a crystal controlled oscillator, it will be appreciated that it can be used for switching both capacitors and inductors in LC circuits.

Referring to FIG. 6a, the capacitor switching arrangement of FIG. 1 is applied to an LC tank circuit including an inductor 41 connected in parallel with the first capacitor 10.

Referring to FIG. 6b, the circuit of FIG. 6a is modified by connecting a fourth capacitor 44 between the drain and source of the MOSFET 11. Consequently, turning on of the MOSFET 11 increases the capacitance of the tank circuit, thereby decreasing the resonant frequency of the tank circuit Referring to FIG. 6c, the circuit of FIG. 6a is modified by replacing the second and third capacitors 12, 13 with second and third inductors 42, 43.

Referring to FIG. 6d, the circuit of FIG. 6c is modified by connecting the second and third inductors 42, 43 in series and arranging to MOSFET 11 to selectively provide a shod between taps on the second and third inductors 42, 43.

In a further alternative embodiment, the MOSFET 11 and the associated capacitors 12, 13 are located in parallel with the crystal 9.

It will be appreciated that many modifications may be made to the embodiments described above without departing from the spirit and scope of the claims appended hereto.

What is claimed is:

1. A tuning circuit comprising:
   a first reactance;
   a second reactance; and
   an insulated gate field effect transistor having a gate arranged to receive a control signal, the first reactance being connected between the source of the field effect transistor and a first node and the second reactance having the same value as the first reactance and being connected between the drain of the field effect transistor and a second node; and
   wherein the first and second nodes are arranged so as to experience a balanced ac signal and there being no circuit connection for grounding the source and drain of said transistor.

2. A circuit according to claim 1, wherein the first and second reactances are capacitors.

3. A circuit according to claim 1, wherein the first and second reactances are inductors.

4. A circuit according to claim 1, including a capacitor connected between said nodes.

5. A circuit according to claim 1, including an inductor connected between said nodes.

6. A tuning circuit comprising:
   a first reactance;
   a second reactance; and
   an insulated gate field effect transistor having a gate arranged to receive a control signal;
   the first reactance being connected between the source of the field effect transistor and a first node and the second reactance having the same value as the first reactance and being connected between the drain of the field effect transistor and a second node;
   wherein
   the first and second nodes are arranged so as to experience a balanced ac signal; and
   the insulated gate field effect transistor comprises source and drain regions within a surrounding region and gate electrode means provided over a channel or channels between said source and drain regions and over at least part of the boundary between said source and drain regions and said surrounding region, said surrounding region being provided with ground connection means for connection to an AC ground.

7. A tuning circuit according to claim 6, wherein said ground connection means comprises a plurality of interconnected ohmic contacts to said surrounding region.

8. A tuning circuit according to claim 6, wherein said gate electrode means encompasses said source and drain regions.

9. A tuning circuit according to claim 6, wherein said source and drain regions are in a finger structure arrangement.

10. A tuning circuit according to claim 6, wherein said source and drain regions are in a waffle structure arrangement.

11. A tuning circuit according to claim 6, including a plurality of source and drain regions and an interconnection layer in which said source regions are connected together and said drain regions are connected together, the conductor or conductors of the interconnection layer being connected to said source and drain regions by splaying conductive paths.

12. A tuning circuit according to claim 11, wherein said source and drain regions are in a waffle structure arrangement.

13. A tuning circuit according to claim 12, wherein the interconnection layer comprises a source interconnection structure and a drain interconnection structure, said structures comprising respective sets of fingers extending diagonally, with respect to said waffle structure arrangement, which are interdigitated.

14. A tuning circuit according to claim 6, wherein the first and second reactances are capacitors.

15. A tuning circuit according to claim 6, wherein the first and second reactances are inductors.

16. A tuning circuit according to claim 6, including a capacitor connected between said nodes.

17. A tuning circuit according to claim 6, including an inductor connected between said nodes.

18. A resonant circuit including a tuning circuit, the tuning circuit comprising:
   a first reactance;
   a second reactance; and
   an insulated gate field effect transistor having a gate arranged to receive a control signal;
   the first reactance being connected between the source of the field effect transistor and a first node and the second reactance having the same value as the first reactance and being connected between the drain of the field effect transistor and a second node;
   wherein
   the first and second nodes are arranged so as to experience a balanced ac signal; and
   the insulated gate field effect transistor comprises source and drain regions within a surrounding region and gate electrode means provided over a channel or channels between said source and drain regions and over at least part of the boundary between said source and drain regions and said surrounding region, said surrounding region being provided with ground connection means for connection to an AC ground.

19. A resonant circuit according to claim 18, wherein said ground connection means comprises a plurality of interconnected ohmic contacts to said surrounding region.

20. A resonant circuit according to claim 18, wherein said gate electrode means encompasses said source and drain regions.

21. A resonant circuit according to claim 18, wherein said source and drain regions are in a finger structure arrangement.

22. A resonant circuit according to claim 18, wherein said source and drain regions are in a waffle structure arrangement.

23. A resonant circuit according to claim 18, including a plurality of source and drain regions and an interconnection layer in which said source regions are connected together and said drain regions are connected together, the conductor or conductors of the interconnection layer being connected to said source and drain regions by splaying conductive paths.

24. A resonant circuit according to claim 23, wherein said source and drain regions are in a waffle structure arrangement.

25. A resonant circuit according to claim 24, wherein the interconnection layer comprises a source interconnection structure and a drain interconnection structure, said structures comprising respective sets of fingers extending diagonally, with respect to said waffle structure arrangement, which are interdigitated.

26. A resonant circuit according to claim 18, wherein the first and second reactances are capacitors.

27. A resonant circuit according to claim 18, wherein the first and second reactances are inductors.

28. A resonant circuit according to claim 18, including a capacitor connected between said nodes.

29. A resonant circuit according to claim 18, including an inductor connected between said nodes.

30. A resonant circuit according to claim 18, comprising an oscillator.

31. A resonant circuit according to claim 18, comprising a filter.

* * * * *